United States Patent [19]
Hendrix et al.

[11] Patent Number: 5,891,553
[45] Date of Patent: Apr. 6, 1999

[54] CROSSLINKABLE POLYMERIC COATINGS AND FILMS AND COMPOSITE STRUCTURES INCORPORATING SAME

[75] Inventors: James Easton Hendrix, Pacolet; Dennis Joseph Vaughan, Anderson, both of S.C.; James Lee Rakes, Wichita Falls, Tex.; John Henry Walker, Bartlesville, Okla.

[73] Assignee: Clark-Schwebel, Inc., Anderson, S.C.

[21] Appl. No.: 726,246

[22] Filed: Oct. 4, 1996

Related U.S. Application Data

[62] Division of Ser. No. 577,916, Dec. 21, 1995.
[51] Int. Cl.$^6$ ........................................................ B32B 3/00
[52] U.S. Cl. ............................ 428/209; 428/220; 442/62; 442/136; 442/138; 442/139; 442/146
[58] Field of Search ............................. 442/62, 136, 138, 442/139, 146; 428/209, 220

[56] References Cited

U.S. PATENT DOCUMENTS

| | | |
|---|---|---|
| 2,714,571 | 8/1955 | Irion et al. . |
| 3,013,915 | 12/1961 | Morgan . |
| 3,081,195 | 3/1963 | Biefeld . |
| 3,094,449 | 6/1963 | Sisson . |
| 3,222,237 | 12/1965 | McKelvy . |
| 3,352,742 | 11/1967 | Zunich et al. . |
| 3,371,002 | 2/1968 | Reddeman . |
| 3,437,550 | 4/1969 | Paul, Jr. . |
| 3,470,055 | 9/1969 | Wade . |
| 3,472,729 | 10/1969 | Sterman et al. . |
| 3,480,584 | 11/1969 | Archer et al. . |
| 3,558,423 | 1/1971 | Rossetti, Jr. . |
| 3,646,155 | 2/1972 | Scott . |
| 3,706,592 | 12/1972 | Thomson . |
| 3,788,923 | 1/1974 | Soliman . |
| 3,876,613 | 4/1975 | Needham et al. . |
| 3,929,550 | 12/1975 | Gaylord . |
| 3,940,547 | 2/1976 | Needham et al. ...................... 428/463 |
| 3,945,877 | 3/1976 | Marcozzi . |
| 4,214,030 | 7/1980 | Rakes et al. . |
| 4,225,650 | 9/1980 | van Brederode et al. . |
| 4,226,905 | 10/1980 | Harbourne . |
| 4,292,106 | 9/1981 | Herschdorfer et al. ................. 156/243 |
| 4,395,459 | 7/1983 | Herschdorfer et al. . |

FOREIGN PATENT DOCUMENTS

| | | |
|---|---|---|
| 0 110 332 | 6/1984 | European Pat. Off. . |
| 930039 | 8/1961 | United Kingdom . |

OTHER PUBLICATIONS

"New Line On Pipe List", Chemical Week, vol. 93, p. 37 (Aug. 24, 1963).
"New Wraps For Cable", Chemical Week, vol. 93, p. 43 (Jan. 11, 1964).
E.D. Gant and D.A. Trageser, "Industrial Applications of Electron Accelerators", J. Brit. Nuclear Energy Sol., vol. 6, p. 339 (1967).
J.R. Flesher, "Vulcanizable Polyethylene and High Voltage Cable Insulation", Wire and Wire Products, vol. 42, p. 622 (Apr. 1967).
"PE Foam Sets Up For Expansion", Modern Plastics International, vol. 2, p. 14 (Apr. 1972).
H.G. Scott and J.F. Humphries, "Novel Crosslinking Method For Polyethylene", Modern Plastics, vol. 50, p. 82 (Mar. 1973).
Patent Abstracts of Japan vol. 013, No. 154 (M–814), 14 Apr. 1989, & JP 63 315214 A (Hitachi Cable Ltd.), 22 Dec. 1988.
R.C. Peer, Jr. & D.J. Vaughan, "The Use of Polyethylene in Printed Circuit Laminates," Society of Plastics Engineers, 33rd Annual Tech. Conf., May 5–8, 1975, p. 443.
A.S. Wood, "New Day Dawns For Circuit Boards", Modern Plastics, vol. 54, p. 52 (Jun. 1977).
D.V. Rosato, "Electrical Wire and Cable Plastics Coating—What's Ahead", Wire and Wire Products, vol. 45, p. 49 (Mar. 1970).
L.M. Sloman, "Advantage of Power Cables With x.i.p.e & Insulation", Electrical Times, p. 8 (Apr. 1970).
T. Engel, "Forging and Crosslinking of Thermoplastics", Plastics and Polymers, vol. 38, p. 174 (Jun. 1970).
"Halbzeuge Ausvernetztem Polyathylen", Kunststoffe, vol. 60, p. 402 (Jun. 1970).
"Cross–Linked PE Foam Goes Commercial", Modern Plastics, vol. 44, p. 100 (May 1967).
J.E. Hagar, "Guide To Wire And Cable Coating: Part 2–Extending Crosslinkable PE", Plastics Tech., vol. 15, p. 55 (Jul. 1969).
W. Noll, Chemistry and Technology of Silicones, "Production of Technical Silicone Products From Polyorganosiloxanes", Chapter 8, Academic Press, N.Y. (1968).
K.S. Tenney, "Injection Molding Crosslinkable Polyoelfins," SPE 27th Annual Conference Papers, vol. 15, p. 191 (1969).

*Primary Examiner*—Helen L. Pezzuto
*Attorney, Agent, or Firm*—Bell Seltzer Intellectual Property Law Group of Alston & Bird LLP

[57] ABSTRACT

A film having a width of at least about one foot as defined by the cross machine direction thereof and a substantially uniform average thickness of less than about 10 mils is formed of a crosslinkable thermoplastic olefin polymer, a crosslinking agent, and preferably a flame retardant. The film can be combined with a suitable substrate to form a prepreg or coated substrate, and the prepreg or coated substrate can be subsequently treated under conditions to crosslink the olefin polymer and to form a rigid composite structure. The composite structure is particularly useful for printed circuit board applications.

6 Claims, 1 Drawing Sheet

CROSSLINKABLE POLYMERIC COATINGS AND FILMS AND COMPOSITE STRUCTURES INCORPORATING SAME

This application is a divisional of application Ser. No. 08/577,916, filed Dec. 21, 1995 pending.

FIELD OF THE INVENTION

This invention relates to polymeric films, coatings, core materials and laminates, and more specifically to crosslinkable polymeric films, coatings, core materials and laminates, and to processes for making the same.

BACKGROUND OF THE INVENTION

Thermoplastic and thermosetting polymers and resins are widely used in a variety of applications, and can be particularly useful as a component of a reinforcing composite structure. For example, phenolic/paper, epoxy/paper, epoxy/cotton, epoxy/glass fabric and several other types of reinforced laminates are presently used by the electrical industry as wire and cable insulation and as components in various electronics applications, particularly as the "board" component in conventional printed circuit boards. Each of these materials varies in usefulness depending upon cost, dielectric properties, and operating temperatures.

Reinforced composites are also used as structural components for various moldable structures, including sheet molding compositions and the like as are used to fabricate automotive body parts, sports equipment, furniture, medical products, agricultural products, industrial products, toys, containers, appliances and the like.

Thermoplastic polyolefins, because of their moldability and other properties, are widely used in molding applications, such as in the formation of sheet molding compositions. In addition, by virtue of their hydrocarbon structure, thermoplastic olefin polymers would be particularly useful for electronic applications requiring low dielectric loss properties and good electrical insulation were it not for their low melting points. Thermoplastic polymeric materials typically melt below temperatures required for soldering and other manufacturing steps in printed wiring board manufacturing and applications. Polyethylene would be particularly suitable for applications requiring minimal electrical loss in terms of dissipation factor and loss tangent due to radio-frequency energy interference. In such highly demanding electronic environments, the epoxies and like thermoset polymers as are conventionally used in electronic applications provide increasingly unsatisfactory to inadequate protection against electrical loss.

Polyolefins have been combined with a suitable reinforcing substrate, such as a glass fabric, to produce laminates having some of the thermosetting properties of materials like the epoxy laminates. The use of such a reinforcing substrate can improve the physical properties of the resin and produce a reinforced polyolefin possessing good dimensional, tensile, flexural, bursting and tear properties. Nevertheless, in many applications, reinforcing composite structures need to be flame-retardant, drip resistant, and have low thermal expansion properties, particularly in the Z-axis direction. Because polyolefins have a relatively low softening point, poor heat resistance and high Z-axis thermal expansion, the polyolefins are unsuitable for many applications requiring the use of heat, for example, in the fabrication of circuit boards, where the addition of metallic foils followed by some form of soldering is required. As a result, although polyolefin laminates have the desired electrical or other characteristics and adequate strength, exposure of the laminates to elevated temperatures can generally result in thermal distortion and delamination of the laminate. Further, because of their thermoplastic properties, polyolefins can drip when heated; and due to their hydrocarbon-based chemical structure, they are not flame retardant.

Polyolefins can be crosslinked and then combined with a reinforcing substrate such as a glass fabric to address issues of structural stability under high temperature conditions. Crosslinking can be achieved by irradiating sheets of crosslinkable polyolefin with high energy electrons after extruding the sheets and prior to forming a laminate. Reinforced polyolefin laminates of this type have been fabricated by combining a thermoplastic olefin polymer such as polyethylene crosslinked by irradiation and a reinforcing substrate such as a woven glass fabric by applying the polymer to the reinforcing substrate and then heating the laminate to fuse the resin to the substrate. Irradiation of the polymer sheet material and the subsequent assembly of the sheet material into a laminate by combining the sheet material with a reinforcing substrate and heating the combination under pressure to achieve consolidation is, however, expensive and difficult to maintain a consistent treatment in continuous production.

Crosslinked polyolefin laminates can also be chemically achieved by physically blending a free radical initiator with polyethylene pellets. The formation of a laminate structure using such polyethylene pellet/initiator blends under appropriate high temperature conditions initiates the crosslinking reaction. Such crosslinking has, however, produced a non-homogenous variable dielectric polyolefin material. This can be particularly disadvantageous in microelectronic applications, where polymer consistency is critical to achieving a structure, such as a circuit board substrate, having highly uniform dielectric properties.

U.S. Pat. Nos. 4,395,459 and 4,292,106, issued Jul. 26, 1983, and Sep. 29, 1981, respectively, to Herschdorfer and Vaughan, are directed to a process for producing reinforced laminates from crosslinkable thermoplastic olefin polymer materials and to the resultant reinforced laminate products. A mixture of a crosslinkable thermoplastic olefinic polymer containing a free radical initiator which can be subsequently activated to crosslink the polymer is extruded to form a continuous non-reinforced film. The film can thereafter be combined with a reinforcing substrate to form a coated fabric or prepreg, and in turn, the prepreg can be subsequently heated under pressure to a temperature above the free radical initiator activation temperature to initiate reaction with the polymer and to effect substantially complete crosslinking of the polymer. This converts the thermoformable prepreg into a permanently shaped, i.e., non-thermoformable structure. The resultant reinforced laminates are stated to exhibit excellent physical properties, particularly flexibility, high strength and resistance to heat, as well as excellent electrical properties, good chemical and solder resistance and none of the drip characteristics normally associated with thermoplastics.

Despite the highly desirable properties reported in the '459 and the '106 patents, the laminates disclosed therein have not been commercially manufactured because of difficulties associated with the processing techniques disclosed therein, and the resulting shortcomings of the products. In particular, due primarily to the heat activatable crosslinking properties of the polymer melt, processing parameters of heat and shear must be rigidly controlled during the film formation step to avoid premature crosslinking of the polymer and the accompanying permanent hardening of the polymer within the interior of the extrusion apparatus and dies. The lack of substantial flexibility to vary polymer temperature, in turn, greatly limits the availability of traditional processing controls in which different temperature conditions are employed to control the rheological properties of the melt during film formation.

For example, when molten polymer is fed into the central portion of a film forming die, the polymer extruded from the edge portions of the die must travel along a longer path prior to reaching the exit point of the die as compared to polymer extruded from the middle of the die. If the polymer having a longer residence time in the die is cooled to a greater extent than polymer experiencing a shorter residence in the die, the viscosity of the different polymer portions will be different with the result that film properties, particularly thickness, will be variable. Although die feed and cavity structures can be designed to minimize any polymer residence differences, it is difficult to completely eliminate dead spots within the die and/or ensure that all polymer traveling through the die will have the same heat history.

In conventional extrusion processes, i.e., melt extruding polyolefin polymers without a crosslinking agent, these difficulties can be addressed by increasing polymer temperature, thus lowering viscosity, and/or by increasing polymer throughput. However, the limited temperature flexibility available in the extrusion of crosslinkable polyolefin polymer/free radical initiator mixtures precludes substantial reliance on these traditional remedies. For example, when a heat activatable crosslinking agent is present in the resin, the freedom to operate the extrusion process within a wide range of temperatures (i.e., at higher temperatures) is not available. This can be significant in that even small temperature changes can greatly impact polymer viscosity, and thus greatly impact the ability to produce uniform polymer films. Even with improved temperature controls, it can be nearly impossible to operate a melt extrusion process so that the polymer has the same heat history and behaves the same across a film width.

As film thickness increases, the differentials in polymer heat history, and resulting differences in film thickness, are less problematic. However, for many applications, such as printed circuit boards, it is advantageous to significantly decrease film thickness to provide desired polymer-to-substrate ratios. However, as film thickness decreases, particularly as film width increases, the possibilities for differentials in polymer temperature history is significantly affected. Further, as both film thickness decreases and film width increases, any such differences in the heat history of the polymer are significantly magnified. As a result, not only is non-uniform film thickness a problem, but voids in the film can also occur.

As a result, those skilled in the art have not produced, commercially or experimentally, a relatively low thickness, large width composite sheet products, i.e., sheets having a thickness of about 10 mils (0.010 in) or less and a width above about one foot, and higher, in accordance with the Herschdorfer and Vaughan '459 and '106 patents. Similarly, no films or other sheets having an average thickness substantially less than about 5 mils (0.005 in) have been produced experimentally or commercially that avoid substantial variations in film thickness of greater than about plus or minus 20% based on average film thickness across the width of the sheet for films of a width exceeding about one foot, and higher.

From a commercial standpoint, the width of the composite sheet can be important for numerous reasons. These reasons include the ability to use currently available converting equipment to form articles or components from the composite, and economic penalties associated with small scale manufacturing operations which necessarily result from commercial production of end products or components from low width composite sheets.

Further, in high value-added end use applications, particularly electronic and other technically demanding applications, the uniformity of polymer distribution in the final laminate and/or the ratio of resin to reinforcing substrate can be important factors in determining the properties, and thus the usefulness, of the end product.

If too much or too little polyolefin is present in the structure relative to reinforcing materials such as glass or other fibers, or if the distribution of the polyolefin throughout the composite cannot be precisely controlled, important product properties can be sacrificed. Thus the strength of the composite can suffer, or in the case of multi-layered laminates, the laminate stability and the layer-to-layer bonding strength can be unsatisfactory. Moreover, these same shortcomings can prevent products from meeting dielectric and insulation/conductivity property specifications in the case of electronic components.

SUMMARY OF THE INVENTION

The present invention provides polymeric crosslinkable sheets of commercially desirable and useful widths of at least about one foot as defined by the cross machine direction of the sheet, and preferably at least about two feet, and more-preferably about three feet, and wider. The sheets of the invention include crosslinkable thermoplastic films; prepregs or coated substrates which include a crosslinkable thermoplastic film as a component thereof; composite laminate structures including a plurality of stacked crosslinked prepregs or coated substrates of the invention; and core materials such as honeycombs or structural forms sandwiched between composite laminate sheets of the invention.

The sheets of the invention can have a substantially reduced average polymer thickness in the z-axis direction of the sheets. The average thickness of the polymer component in the z-axis of the sheets of the invention is less than about 10 mils, preferably less than about 5 mils, and in some instances preferably less than about 1 mil.

Further, the sheets of the invention can have a substantially uniform distribution of polymer across the width and length thereof, even as the average thickness of the polymer in the z-axis direction of the sheet decreases, as compared to thermoplastic crosslinkable films prepared using prior techniques.

The thickness of the polymer component can be determined conventionally, for example, by measuring the mass of polymer at a plurality of spaced apart locations along the length and width of the sheet. For example, to measure polymer thickness of a film of the invention, a conventional scanning Beta gauge can be set to scan the sheet across its width as the sheet continuously travels in a longitudinal direction and to take one mass reading per unit of sheet scanned (i.e., one measurement per one inch of sheet scanned), such that the Beta gauge measures polymer mass both across the width and along the length of the moving sheet. The mass measurements can be converted to mils of polymer, and the average thickness of polymer in the z-axis direction calculated using a microprocessor. In an exemplary technique, polymer thickness is determined by measuring the mass of the sheet at about 50 locations continually spaced about 0.5 to 1 inches across the width of the sheet using a conventional transversing Beta gauge, repeated several times per minute along the length of the sheet.

Uniform prepregs can be made by starting up an extrusion line to extrude film having the desired polymer uniformity, determined as described above, and thereafter applying the film to a substrate. The resultant prepreg likewise has a highly uniform coating of polymer. The uniformity of polymer distribution on the substrate can be measured if desired by obtaining enough swatch samples of a uniform surface area (e.g., from about 0.25 to about 1.0 square inch) that are representative of the entire width of the sheet. The number of samples taken is an amount sufficient to be statistically reliable and which allows such determination. Polymer can thereafter be extracted from each swatch using conventional techniques, for example dissolution in an appropriate solvent, and weighing the extracted polymer.

Uniformity of polymer distribution across the dimensions of the sheets of the invention is thus determined by measuring the mass of polymer as described above. The distribution of polymer across the sheets of the invention preferably varies no more than about plus or minus 25% in the y-axis direction (i.e., width) of the polymer, preferably no more than about plus or minus 20%, and more preferably no more than about plus or minus 10%.

Because the sheets can have widths of up to at least about one foot and higher, the sheets can be converted into products such as circuit boards using currently available equipment. The sheets can also be readily subjected to conventional manufacturing steps using currently available techniques and equipment for forming composite structures or components useful in automotive, aerospace or consumer products. Because of the increased widths of the sheets, they can be processed without substantial economic penalty.

In the sheets of the invention, the thickness of the polymeric component is readily controlled, both with regard to the average thickness thereof and with regard to control of variations in the thickness of the polymeric component across the width of the sheet material. Accordingly, the sheets of the invention can be useful for many applications requiring controlled properties, and are particularly desirable as components of composite structures for electronic applications. For example, providing a sheet including a polymer component having a substantially reduced thickness, as well as substantially uniform polymer thickness across the width of the sheet, can result in improved end product characteristics, such as highly uniform electronic and strength properties and improved laminate stability, i.e., reduced slippage of layers during manufacture and increased adhesion of layers to one another, and the like.

The sheets of the invention include a crosslinkable thermoplastic olefin polymer and a crosslinking agent. The crosslinking agent is capable of reacting with and effecting crosslinking of the olefin polymer upon thermal activation, and preferably has an activation temperature higher than the melting temperature of the olefin polymer; however, crosslinking agents with thermal activation temperatures lower than the melting point of the polymer may be employed. Exemplary polymers include ethylene homopolymers, copolymers of ethylene and at least one acyclic mono-alpha-olefin hydrocarbon having 2 to 8 carbon atoms per molecule and mixtures thereof. Preferably, the polymer is high density polyethylene. The crosslinking agent can be any of various thermally activatable crosslinking agents known in the art, and preferably is a high temperature activatable free radical initiator, and more preferably is an organic peroxide based crosslinking agent.

The crosslinkable sheets of the invention may be produced by melt extrusion, preferably an extrusion casting process, although other melt extrusion processes may be used, in which a molten composition comprising a mixture of the crosslinkable thermoplastic olefin polymer and the crosslinking agent is extruded through a linear film forming die having a width of at least about one foot and a die gap sufficient to provide a polymeric film average thickness in the z-axis direction of about 10 mils or less. Extrusion conditions are controlled to provide a flowable composition and also to prevent initiation of the crosslinking agent. The die advantageously includes microprocessor controlled heating elements that maintain the polymer at highly uniform temperature conditions throughout the die.

The molten extrudate exits the die and is directed to a metal casting roll to form a film. The casting roll rotates at a speed sufficient to draw down the extrudate in a ratio of about 3:1, preferably about 4:1, and more preferably about 5:1, and higher.

In one aspect of the invention, the molten polymer exiting the die is applied to a substantially planar reinforcing substrate. The polymer film/substrate structure is directed to the nip formed between cooperating rolls, which include a conventional metal casting roll and a pressure roll having an elastomeric surface to provide a continuous composite laminate sheet or coated substrate.

Preferably, the polymer film is adjacent the elastomeric pressure roll. The elastomeric surface of the pressure roll has a hardness sufficient to apply pressure against the film while also distributing the still soft polymer uniformly across the substrate, thereby minimizing variations in the uniformity of the thickness, i.e., z-axis, of the film. The pressure roll must be sufficiently rigid to distribute the polymer and also sufficiently elastomeric so as to avoid distortion of the film as the film passes through the nip. The inventors have found that a rubber roll having a shore hardness as determined by ASTM D2240 using a shore A scale of 0–100 durometer of between about 55 A and about 90 A is particularly advantageous.

A variety of substrates can be used, but preferably the substrate is a porous reinforcing material, more preferably a woven fibrous sheet material. Most preferably the reinforcement substrate is a woven fibrous glass fabric. As the polymer film and reinforcing sheet are combined in the nip to form a prepreg, the elastomeric pressure roll acts as a consolidator to provide a desired degree of penetration or impregnation of the film into the adjacent substrate surface to form a unitary, substantially flexible web or sheet. In this embodiment of the invention, it is advantageous to heat the elastomeric pressure roll sufficiently to assist with the consolidation of the film onto the substrate surface. It can also be advantageous to heat the substrate prior to combining the substrate with the extruded film. This is also believed to assist in consolidation and penetration of the film uniformly into the substrate.

Following formation of the films and coated or pre-impregnated sheets of the invention, the sheet materials are subjected to conditions of heat and/or pressure sufficient to effect activation of the crosslinking agent and to thereby crosslink the olefin polymer to form a substantially rigid matrix polymer or reinforced polymer composite structure. The films and pre-impregnated sheets can be crosslinked in an in-line processing step or in a separate processing step. Alternatively, the continuous film or prepreg sheet can be cut into pieces of desired size which are placed adjacent to one another, i.e., stacked on top of one another, and consolidated under heat and/or pressure conditions to form a multi-layered composite structure. The multi-layered composite structure can be crosslinked simultaneously during formation or can subsequently be treated to form a substantially rigid multi-layered composite laminate structure.

The substantially rigid multi-layered composite structures of the invention exhibit numerous advantageous properties. For example, composite laminate structures can be produced which exhibit good electrical charge dissipation properties and desirable dielectric loss properties. Further, composite laminate structures of the invention can exhibit good peel strength, in particular, good copper peel strength, and excellent drilling properties. The composite laminate structures are useful for a variety of applications, such as circuit boards, automotive body parts, and the like.

BRIEF DESCRIPTION OF THE DRAWING

In the drawing which forms a portion of the original disclosure of the invention.

DETAILED DESCRIPTION OF THE INVENTION

Figure 1:
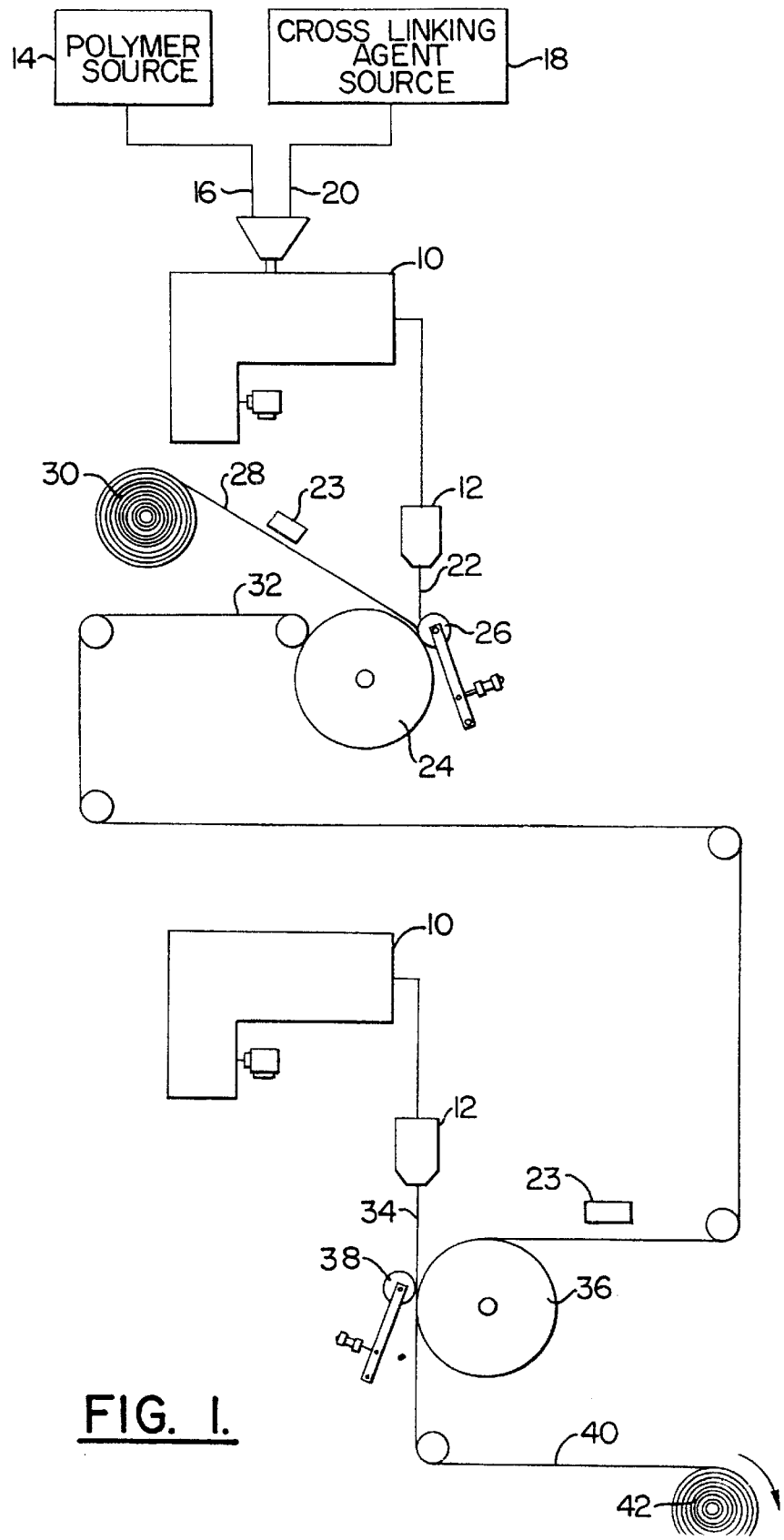
FIG. 1 is a schematic illustration of a preferred apparatus and process for cast extruding a crosslinkable thermoplastic olefin polymer film in accordance with the process of the invention and for forming composite laminate sheets of the invention.

In the following detailed description of the invention, specific preferred embodiments of the invention are described to enable a full and complete understanding of the invention. It will be recognized that it is not intended to limit the invention to the particular preferred embodiments described, and although specific terms are employed in describing the invention, such terms are used in the descriptive sense for the purpose of illustration and not for the purpose of limitation. It will be apparent that the invention is susceptible to numerous variations and changes as will be apparent from a consideration of the foregoing discussion and the following detailed description.

FIG. 1 schematically illustrates a side view of a preferred apparatus and process for cast extruding a crosslinkable thermoplastic olefin polymer film and for coating or pre-impregnating reinforcing sheets incorporating the thus extruded film, in accordance with the present invention. FIG. 1 illustrates an extruder 10 provided with a linear die head 12 both of which are cooperatively employed for heating and melting a polymer, and for extruding the polymer to form a continuous sheet or film, respectively. The linear die head 12 is of a linear width capable of extruding a polymer melt in widths of up to about one foot, preferably up to about two feet, and more preferably up to about three feet, and higher. As explained in more detail below, the die head includes a die gap that can be adjusted to provide a molten polymer extrudate having a thickness of up to about 50 mils. Although the die gap can be varied depending on polymer viscosity and throughput, typically the die gap is within the range of between about 0.002" and about 0.050", preferably about 0.005" and 0.020".

Preferably, the die head is configured to provide a substantially uniform flow of polymer evenly distributed across the die. A currently preferred die employs a "coat hanger" type configuration, as known in the art. An exemplary linear coat hanger die head is commercially available from Extrusion Dies, Inc., although as the skilled artisan will appreciate, other die head types and configurations can be used which provide for the substantially uniform flow of polymer evenly distributed across the die head.

The polymer is prepared for use in the process of the invention by forming a substantially uniform or homogenous blend of the polymer with a polymer crosslinking agent. Each of the polymer and the crosslinking agent is described in more detail below. Typically, the blend of the polymer and the crosslinking agent prepared by dry blending solid state forms of the polymer and the crosslinking agent, i.e., in powder form. However, the blend may be prepared using any of the techniques known in the art for preparing a simple blend, such as preparing a blend from the components in liquid form, sorbed in inert powdered support and by preparing coated pellets, and the like.

FIG. 1 illustrates preparation of the blend by dry blending powder forms of the constituent parts of the blend. A polymer from polymer source 14 is supplied through feed line 16 to extruder 10. Similarly, a crosslinking agent from crosslinking agent source 18 is supplied to the extruder 10 through feed line 20. The polymer and the crosslinking agent can be premixed or finally mixed within the extruder to provide the polymer/crosslinking agent blend.

As illustrated, separate supply lines for the polymer and for the crosslinking agent can be provided such that mixing of the polymer and crosslinking agent occurs within the screw extruder. Alternatively, the polymer and crosslinking agent can be directed to a mixing apparatus as known in the art for preparing a simple blend, and the blend then directed to the extruder 10. The polymer can also be compounded with the crosslinking agent in an upstream process (not shown) and the compounded mixture supplied to extruder 10 from a single source.

The principles of the present invention are applicable to any crosslinkable polymer or polymer blend which is capable of being melt extruded to form a sheet or film material. However, the present invention is especially advantageous with respect to polyolefins. Exemplary polyolefins include any homopolymer or copolymer of at least one mono-alpha-olefin having 2 to 8 carbon atoms per molecule, for example, polymers of ethylene, propylene and butene-1, and copolymers of ethylene and butene-1 and ethylene and hexene-1. Ethylene homopolymers, copolymers of ethylene and at least one acyclic mono-alpha-olefin hydrocarbon having 2 to 8 carbon atoms per molecule, and mixtures thereof, are preferred, and more preferably such polymers having a density in the range of about 0.910 to about 0.980. Especially preferred polymers are high density polyethylene polymers. The term "polyethylene" is used herein in a general sense and is intended to include various homopolymers and copolymers of ethylene, including low density polyethylene, high density polyethylene and linear low density polyethylene. In addition, preferably, the polymer has a high melt index, i.e., a melt index between about 10 and 100, and preferably between about 15 and 70, to facilitate extrusion of the polymer below the crosslinking agent initiation temperature. However, polymers having a melt index from below 0 to about 200 can also be used.

Preferably, the polymer has a very low residual polymerization catalyst (i.e. Ziegler-Natta, Aluminum alkyl-titanium halide catalyst or chrome-silica-alumina catalyst) content, preferably less than 20 ppm, and more preferably less than 3 ppm. Olefinic polymers having very low residual catalyst content are commercially available. As explained in more detail, low residual catalyst content is desirable to decrease the formation of voids or bubbles in the molten polymer and films and coatings thereof.

Thermally activatable crosslinking agents useful in the invention include any of the free radical generating chemicals known in the art. Such chemicals when exposed to heat decompose to form at least one, and typically two or more free radicals which attack the polymer, and can affect crosslinking thereof. Any of the crosslinking agents known in the art may be used in accordance with the present invention, but preferably the crosslinking agent is an organic crosslinking agent, more preferably an organic peroxide-based crosslinking agent, and most preferably an acetylenic dialkyl diperoxy crosslinking agent.

Exemplary organic peroxide free radical initiators which can be used in accordance with the process of the invention include, but are not limited to, 2,7-dimethyl-2,7-di(t-butylperoxy)octadiyne-3,5;2,7-dimethyl-2,7-di(peroxy ethyl carbonate)octadiyne-3,5;3,6-dimethyl-3,6-di(peroxy ethyl carbonate)octyne-4;3,6-dimethyl-3,6-(t-butylperoxy) octyne-4;2,5-dimethyl-2,5-di(peroxybenzoate)hexyne-3;2, 5-dimethyl-2,5-di(peroxy-n-propyl carbonate)hexyne-3;2,5-dimethyl-2,5-di(peroxy isobutyl carbonate)hexyne-3;2,5-dimethyl-2,5-di(peroxy ethyl carbonate)hexyne-3;2,5-dimethyl-2,5-di(alpha-cumyl peroxy)hexyne-3;2,5-dimethyl-2,5-di(peroxy beta-chloroethyl carbonate) hexyne-3; and 2,5-dimethyl-2,5-di(t-butylperoxy) hexyne-3. The currently preferred crosslinking agent is 2,5-dimethyl-2,5-di(t-butyl peroxy)hexyne-3, available from Elf Atochem under the trade designation Lupersol 130. Another exemplary crosslinking agent is dicumyl peroxide, available from Elf Atochem as Luperox 500R. Other types of free radical initiators can also be used. Preferably, the crosslinking agent is present in the polymer in an amount between 0.1 to 5%, preferably 0.5 to 2%, by weight based on the weight of the polymer.

In addition to the crosslinking agent, the composition can also include as part of a crosslinking system a mono- or poly-functional crosslinking co-agent capable of crosslinking in the presence of a free radical initiator, as known in the art. As the skilled artisan will appreciate, co-agents graft or polymerize to chains in the crosslinkable polymer and act to crosslink the polymer chains. Exemplary co-agents include trifunctional unsaturated molecules, such as a triallyl isocyanurate and triallyl cyanurate. When present, preferably the co-agent is present in an amount of about 0.1 to 1.0 percent by weight, based on the weight of the polymer. In some instances, it can be desirable to use as much as 6 percent by weight of co-agent.

Various preferred polymers and crosslinking agents are disclosed in the previously mentioned U.S. Pat. Nos. 4,395, 459 and 4,292,106, issued Jul. 26, 1983, and Sep. 29, 1981, respectively, to Herschdorfer and Vaughan which are hereby incorporated by reference.

As stated above, the crosslinking agent decomposes when exposed to heat to form one or more free radicals. The crosslinking agent should have a decomposition (also referred to as "activation") temperature profile such that the majority of decomposition occurs above the melting temperature of the polymer so that a polymer/crosslinking agent composition can be easily melt blended and extruded without effecting substantial crosslinking of the polymer prior to conversion of the melt blend into a thermoplastic film. Thus, crosslinking agents with thermal activation temperatures lower than the melting point of the polymer may be employed. When the thus extruded film is later subjected to appropriate thermal activation conditions which may be for short periods of time (i.e., minutes, hours) at high temperatures (i.e., 350°–550° F.), or conversely may be for long periods of time (i.e., hours, days, weeks) at low curing temperatures (i.e., 200°–350° F.), the crosslinking agent is activated and crosslinking of the polymer is effected to convert the thermoplastic flexible film to a substantially thermoset material.

By way of example, a preferred polyethylene polymer has an intrinsic viscosity such that the polymer will soften and deform when heated to a temperature of about 250° F. or less and will melt at a temperature above 250° F. The organic peroxide agents listed above decompose and will react with and effect crosslinking of the polymer when heated to a temperature between about 300° F. and about 525° F. Thus, in accordance with the process of the invention, a polyethylene polymer containing a peroxy based crosslinking agent as described above is heated to a molten state at a temperature between about 270° F. and about 300° F., and preferably at a temperature of about 290° F. to about 299° F.

As discussed previously, it is advantageous to increase polymer processing temperatures when forming uniform thin films to lower polymer viscosity and/or increase polymer throughput. This can minimize or eliminate differential temperature histories of the polymer. However, to prevent premature activation of the crosslinking agent, temperature of the crosslinkable olefinic melt must be carefully monitored.

A continuous sheet is formed from the molten polyethylene using the extruder and linear die head generally identified by reference numerals 10 and 12 in FIG. 1. It should be noted that it is necessary to carefully control the temperature at which the polymer is supplied to the die and extruded under pressure through the die. This temperature should be maintained below the decomposition temperature of the crosslinking agent, yet high enough, i.e., at least at the melting temperature of the polymer, so that composition can flow to form a sheet extrudate material. Preferably the polymer temperature is maintained within a range of about 5° F. above and below a set average as it is supplied to the die and within a range of between about 5° F. above and below a set average as it passes through the die head. When the film is consolidated onto a substrate, as described below, the heat-softened polymer can also penetrate the interstices of a substrate.

Any of the techniques and apparatus for monitoring and controlling the temperature of a polymer in an extrusion process known in the art can be used in the present invention. For example, multiple thermocouples associated with a microprocessor control are advantageously distributed along the polymer supply line and across the width of the orifice through which the polymer is extruded to monitor and control the temperature of the polymer film as it is extruded through the die. The temperature of the extrudate can be adjusted as necessary to prevent premature initiation of the crosslinking agent while also maintaining desirable rheological properties as the polymer is processed. It is particularly advantageous to use a plurality of thermocouples associated with heating elements via a microprocessor control and which are placed at locations spaced apart across the width of the die gap to monitor and maintain the temperature of the extrudate within a predetermined temperature range.

Further, thermocouples and heating elements can also be used in other locations of the extruder, for example, in the barrel to monitor the temperature of polymer mixing and melt, in the head of the extruder just prior to extruding the polymer composition, etc. It can also be advantageous to provide control devices for monitoring and adjusting other parameters of the extrusion process, such as the die gap width to control the thickness of the extruded material.

In the currently preferred embodiment of the invention, the heating zones of the extruder are maintained below a temperature of about 300° F. and above a temperature of about 250° F., preferably about 299° F.

The die gap is adjustable so that the thickness of the molten extruded sheet across the width thereof as it exits the gap can be up to 20 mils, and higher. After exiting the die, the molten extrudate travels a predetermined distance, preferably about 4 to about 10 inches, and more preferably about 6 inches, to a conventional metal casting roll. The casting roll rotates at a higher speed than the polymer throughput rate so as to draw down the polymer sheet to the desired thickness. Specifically, the casting roll rotates at a speed relative to the polymer throughput rate sufficient to provide a draw ratio of about 3:1, preferably about 4:1, and more preferably about 5:1 and higher.

For example, to form a crosslinkable thermoplastic film having an average thickness in the z-axis direction of about 5 mils, the die gap can be adjusted so that the molten extrudate as it exits the gap is at least about 15 mils thick across the width thereof. The molten extrudate contacts a casting roll, which rotates at a speed sufficient to draw the film down to an average z-axis thickness of about 5 mils (i.e., at least a 3:1 draw ratio). To form a film having an average z-axis thickness of about 1 mil, draw ratios as high as 8:1 and 10:1 can be used, i.e., the die gap can be adjusted to extrude a 10 mil film, which is drawn at a 10:1 ratio to provide an average 1 mil thick film.

In contrast, in conventional film making processes, 2:1 draw ratios are typically used. The increased die gap and draw ratios of the present invention can provide many advantages. For example, increased die gaps and increased draw ratios can at least in part prevent or minimize "gelling" of the polymer in the gap, which can translate into non-uniform films, and, in some cases, void formation.

The average thickness of the polymer film in the z-axis thereof is less than about 10 mils, preferably less than about 5 mils, and in some instances preferably less than about 1 mil. The average thickness of the film can be determined, for example, by measuring the mass of polymer at a plurality of spaced apart locations along the width and/or length of the film, or along the width and/or length of pre-impregnated webs when the film is coated onto a substrate, as described below.

For example, to measure polymer thickness of a film of the invention, a conventional Beta gauge can be set to scan the sheet across its width as the sheet continuously travels in a longitudinal direction and to take one mass reading per unit of fabric scanned (i.e., about 1 inch apart) such that the Beta gauge measures polymer mass both across the width and along the length of the moving sheet. The mass measurements can be converted to mils of polymer, and the average thickness of polymer in the z-axis direction calculated using a microprocessor. In an exemplary technique, the mass of the polymer film is measured at about 50 locations (although fewer or more locations can be used) continually spaced about 0.5 to 1.0 inches apart across the width of the sheet using a conventional continually transversing Beta gauge, and repeated several times per minute along the length of the sheet.

For example, 1 mil of high density polyethylene has a mass density of about 0.08 ounces per square foot ($oz/ft^2$). If the average of the mass density measurements taken as described above for a film of the invention is about 0.08 $oz/ft^2$, then it is readily apparent that the average thickness of the film is about 1 mil.

Uniform prepregs can be made by starting up an extrusion line to extrude film having the desired polymer uniformity, determined as described above, and thereafter applying the film to a substrate. The resultant prepreg likewise has a highly uniform coating of polymer. The uniformity of polymer distribution on the substrate can be measured if desired by obtaining enough swatch samples of a uniform surface area (e.g., from about 0.25 to about 1.0 square inch) that are representative of the entire width of the sheet. The number of samples taken is an amount sufficient to be statistically reliable and which allows such determination. Polymer can thereafter be extracted from each swatch using conventional techniques, for example dissolution in an appropriate solvent, and weighing the extracted polymer.

Uniformity of polymer distribution can also be determined by measuring .the mass density of polymer as described above. The distribution of polymer across the sheets of the invention preferably varies no more than about plus or minus 25% in the y-axis direction of the polymer, preferably no more than about plus or minus 20%, and more preferably no more than about plus or minus 10%. For example, when extruding a film having an average thickness in the z-axis of about 1 mil, preferably film thickness measured as described above ranges from about 0.8 to about 1.2 mils, and more preferably from about 0.9 to about 1.1 mils.

The cylinder pressure within the extruder barrel generally is maintained from about 0 psig at the feed hopper of the extruder to about 1500 psig at the extruder head, and the die pressure at about 800 to about 1500 psig, depending upon the screw speed. The temperature of the extruded sheet can be maintained at about 270° F. and at about 299° F., and the extruder die temperature between about 250° F. and about 260° F. However, as will be appreciated by the skilled artisan, the specific operating parameters of the process of the present invention can be varied depending upon the specific characteristics of the polymer/crosslinking agent system used. For example, for higher melting polymers, higher extrusion temperatures can be used. Further, screw configurations can be varied depending upon the degree of mixing of the polymer/crosslinking agent blend prior to addition to the extruder. Also, as will be appreciated by the skilled artisan, mixing in the screw during the extrusion process can generate substantial shear and heat, and accordingly the process can be adjusted to compensate for heat generated during mixing.

Advantageously, the screw for mixing and melting the polymer composition can include multiple zones, preferably three zones or sections, as defined by varying flights of the screw threads. The helical flight pattern and channel depth of the screw threads is selected to optimize mixing, consolidation and melting, and metering of the composition respectively in the three zones. Preferably, the channel depth of the screw threads decreases as the polymer passes through the barrel. The bulk density is lowered as the polymer melts, thereby allowing the cross-sectional flow area in the screw to be reduced as the distance to the head of the extruder is less.

For example, the polymer can enter the screw barrel in a first mixing zone wherein the channel depth is selected to provide good mixing of the polymer/crosslinking agent composition. The polymer passes from the mixing zone to a second consolidation zone as defined by a decreased channel depth. The polymer then passes to a third zone for melting the composition, defined by an even smaller channel depth. Of course, the transition of channel depth in each of the zones can be gradual or immediate. Further, fewer or more thread zones can be used. In a currently preferred embodiment of the invention, the channel depth in the first zone is about 0.490" to about 0.500", in the second zone about 0.490" to about 0.180", and in the third zone about 0.170" to about 0.180". The length of each zone and the dwell time of the polymer composition in each zone can be the same or different and is selected according to various factors, such as the degree of mixing of the polymer and crosslinking agent before entering the screw, the desired degree of mixing therein, consolidation, etc. and in accordance with the various polymer/crosslinking agent composition properties.

Referring again to FIG. 1, after the polymer and crosslinking agent composition is heated and extruded to form a film 22, in a particularly preferred embodiment of the invention, the film is subjected to pressure conditions in the nip formed by a pair of cooperating rolls 24 and 26. In this embodiment, as the film passes between the nip of rolls 24 and 26, a substantially planar substrate 28 is concurrently directed from roll 30 into an opposing face-to-face relationship with the film 22 to form a continuous prepreg or coated sheet 32. It can be seen in FIG. 1 that preferably the molten polymer is extruded onto substrate 28 (although other melt extrusion techniques, such as blowing, can also be used) and the film/substrate structure passed between the nip. Further, preferably roll 26 is in direct contact with the molten film, as explained below. The substrate preferably is heated by use of a conventional heater 23, such as an infrared heater as known in the art.

The pressure conditions provided by rolls 24 and 26 is believed to provide a substantially uniform thickness of the sheet across the entire width of the substrate. In particular, the nip is formed by a conventional metal casting roll 24 and an elastomeric, e.g., rubber, roll 26. As discussed above, prior techniques resulted in extruded films having variations in the thickness across the width thereof, which could be problematic in end use applications and limited the commercial feasibility of these prior techniques. This was particularly a problem as the widths of the films increased in the cross machine direction to improve the commercial feasibility and efficiency of the process. Further, prior techniques could not provide a crosslinkable thermoplastic film having desirably reduced and uniform thicknesses. Thus, films having a substantially uniform average thickness of less than about 10 mils, and particularly less than 5 and 1 mils, could not be successfully extruded at commercially feasible widths of about one foot, and higher, using prior techniques.

In contrast, the process of the present invention provides for the production of wide sheets or films of a crosslinkable thermoplastic polymer, i.e., at least about one foot and wider, having a substantially uniform polymer distribution or thickness across the entire width of the film, as described above. Further, sheets or films can be produced having decreased average polymer thickness in the z-direction thereof, of about 10 mils or less, preferably about 5 mils or less, and more preferably about 1 mil or less, also as described above.

To provide the desired uniformity of thickness in the z-direction of the film across the cross machine direction of the substrate, i.e., to control the film thickness variation, a substantially uniform pressure is applied to the extruded film across its width, as defined by the cross machine direction thereof, as it passes through the nip of cooperating rolls 24 and 26. As noted above, advantageously, the distance from the die to the nip is between about 4 to about 10 inches preferably between about 2 to about 6 inches.

The metal casting roll 24 can be any of the types of conventional metal casting rolls known in the art. Preferably, the elastomeric roll 26 has a sufficient hardness to apply the desired degree of pressure against the film and to control variations in the uniformity of the thickness thereof. The elastomeric roll 26, however, is not so hard so as to distort the film as the film passes through the nip. The inventors have found that a rubber roll having a shore hardness as determined by ASTMD-2240 using a shore A scale of 0–100 durometer of between about 55 A and about 90 A is particularly advantageous.

As the film and substrate passes through the nip, the rubber roll can also act as a consolidator to provide a desired degree of penetration or impregnation of the film into an adjacent substrate surface to form a unitary, substantially flexible thermoplastic prepreg or coated substrate. In this embodiment of the invention, it is advantageous to heat the elastomeric roll sufficiently to assist with the consolidation of the film into the substrate such that the polymer penetrates the interstices of the substrate. It can also be advantageous to heat the substrate prior to combining the substrate with the extruded film. This is also believed to assist in consolidation and penetration of the film into the substrate. As the skilled artisan will appreciate, however, the degree of heating can be dependent upon the particular polymer system used, the type of substrate used, the desired degree of impregnation of the film into the substrate (which can also be affected by the amount of pressure exerted upon the laminate sheet as it passes through the nip), and the like.

In a preferred embodiment of the invention the pressure (pounds per linear inch) applied to the film at the nip is between about 50 and 200, and preferably between about 100 and 150. Further, when desired, preferably the rubber roll is heated to a temperature between about 100° F. and about 230° F. In an especially preferred embodiment of the invention each of the casting roll and the substrate are also heated to a temperature between about 100° F. and about 230° F.

Preferably, rolls 24 and 26 and/or substrate 28 are not heated to the initiation temperature of the crosslinking agent so as to avoid or minimize premature crosslinking of the polymer. However, it is contemplated that in certain applications, it could be advantageous to initiate crosslinking of the crosslinkable polymer during this stage of the process, and the pressure and temperature conditions can be adjusted accordingly.

Substrate 28 can be pre-impregnated on both (i.e., opposing) sides with crosslinkable polyolefin. For example, as illustrated in FIG. 1, a second polymer film 34 can be cast or extruded onto coated substrate 32 onto a surface opposite film 22 and passed through the nip formed by a second pair of cooperating rolls 36 and 38. Preferably in this embodiment of the invention, the polymer film 34 and rolls 36 and 38 are the same as described above. However, as will be appreciated by the skilled artisan, a polymer system different from that described above, and with or without a crosslinking agent, can be used to form film 34. It can be advantageous in some applications requiring different properties to have different polymer systems on opposing sides of the coated substrate.

The prepreg sheet 40 is then directed to a wind up roll 42 for storage. Alternatively, the laminate can be passed directly to additional manufacturing steps.

For example, the continuous prepreg sheet can be cut into a plurality of individual sheets by conventional techniques, such as using a shear or sheet cutter as known in the art. The individual sheets can then be placed adjacent, i.e., on top of one another, to form a multi-layered composite laminate structure on application of heat and pressure. This multi-layer composite structure is formed by treatment under conditions sufficient to crosslink the polymer and to transform the stack of prepregs into a substantially rigid, multi-layered composite structure. Such composite laminate structures are particularly advantageous for circuit board applications. The resultant crosslinked polyolefin structure can exhibit several desirable properties for use in electronic applications, such as low dielectric constant, dissipation factor and water absorption, good thermal shock resistance and drillability and dimensional stability.

The sheet laminate can also be shaped and/or molded for use in a variety of other end products which require a moldable component. Exemplary uses include, but are not limited to, components for electronic equipment; automotive body parts, such as hoods, fenders, etc; boat hulls; sporting equipment such as skis; honeycomb, foam, corrugated, and other core structural materials; and the like.

The crosslinkable thermoplastic film, alone or in combination with a substrate, can be crosslinked in any of the previously described forms to fix its shape using known techniques. The polymer can be crosslinked by heating the laminate under conditions sufficient to initiate the crosslinking agent and effect crosslinking of the polymer, i.e., heating the laminate under pressure to a temperature above the decomposition temperature of the crosslinking agent. Exemplary shaping techniques include pressing and compression molding.

The laminate is preferably heated for a time sufficient to react the crosslinking agent and effect substantially complete crosslinking of the polymer, i.e., about 70% or greater crosslinking of the polymer, preferably 75% or greater, more preferably about 80% or greater crosslinking of the polymer, to a three dimensional molecular state known as "C stage" product. More preferably, the reaction time is preferably chosen so that the polymer in the laminate is approximately 95% crosslinked after heating under pressure. The degree of crosslinking of the polymer can be determined using conventional techniques, such as calculating the percentage of the crosslinked polymer which is insoluble in boiling xylene.

The time and temperature used to effect crosslinking of the polymer will vary depending upon the various polymer/crosslinking agent system used, the particular end use of the laminate, and other factors. In one advantageous embodiment of the invention, for circuit board applications, the prepreg is heated to a temperature between about 275° F. and about 525° F. and preferably between about 340° F. and 420° F. for about one to about 60 minutes, and more preferably to a temperature between about 350° F. and about 450° F. for about 5 to 30 minutes. Preferably the prepreg is heated under a pressure between about 100 and 200 psi and preferably between about 75 and about 150 psi.

A continuous laminate may also be produced by heating the prepreg in-line to effect crosslinking immediately after formation of the prepreg; for example, by a heater (not shown) disposed between rolls 36 and 38 and wind up roll 42.

It is noted that the above conditions are particularly advantageous for polyethylene and that variations therefrom may be readily determined for other polyolefins in accordance with the present invention.

The substrate to which the film is applied preferably is a glass fibrous substrate such as woven and nonwoven glass fabrics. Preferably, when the substrate is a glass fibrous substrate, the glass fibers are treated so as to promote both chemical and physical adherence of the polymer film to the surface of the glass fibers. Advantageously, the glass fabric is coated with any of various conventional coupling agents known in the art which are compatible with the polymer and which will produce a bond between the polymer and the surface of the fibers. A bond which is extremely strong and which can be maintained under severe environmental conditions is produced by unsaturated organosilane coupling agents such as vinyltrimethoxy silane, vinylalkyl trimethoxy silanes, and trimethoxysilylpropylacrylate silane. The preferred coupling agent is [gamma (methacrylo)propyl] trimethoxy silane.

Also, although a woven glass fiber or fabric substrate is preferred, the polymer may be applied to other suitable substrates, including metallic, ceramic, glass, and organic substrates. Suitable substrates include woven and nonwoven fabrics constructed of high strength fibers, such as glass, aramid (Kevlar), boron, and the like; polycarbonate and polyarylene sulfide) substrates; metallic or metalized foil; cellulosic or non-cellulosic paper or paper substrates; substrates of differing polymeric structures, such as woven or nonwoven fabrics, fibers, warps of continuous filaments, cord or tow of polyamide, polyester, polyolefin, and other fibers; and the like.

Any of the types of additives known in the art for preparing polymer films can also be included in the extruded polymer composition. For example, in a preferred embodiment, the polymer composition includes a flame retardant agent, such as halogenated hydrocarbons, i.e., chlorine or bromine atoms added to an aliphatic or aromatic hydrocarbon skeleton and antimony trioxide synergist, to render the composite laminate flame resistant. Other flame retardant additives may include intumescents, hydrates and the like, and combinations thereof. Other additives include ultraviolet light inhibitors, calcium carbonate, talc, zinc borate, fumed silica, and the like. Microcrystalline waxes or other polyolefin melt rheology modifiers can be useful for modifying the molten flow characteristics or rheology of the molten polymer, to provide improved blending and flow characteristics at lower processing temperatures, thereby minimizing or eliminating premature initiation of the crosslinking agent. The rheology modifiers can also be useful to improve the laminate properties by modifying the crystalline nature of the resolidified film to impart a stiffer, more stable hand to the composite. Reinforcing and filling materials, such as coated and uncoated $TiO_2$, glass, aramid (i.e., Kevlar), polyimides, boron or similar materials, or other compositions in the form of beads, fibers, mats, woven or nonwoven fabric, warps of substantially continuous filaments, cord or tow of fibers, can also be added or compounded into the polymer to improve the properties thereof.

In addition, various chemical agents, i.e., fillers can be added to the polymer composition to significantly lower the coefficient of thermal expansion ("CTE") in the Z-direction of the laminates of the invention. Fillers useful for lowering the CTE of the laminates can have varying shapes, i.e., rod shaped, spherical, platelets, and varying sizes. Exemplary CTE reducing fillers include calcium carbonate and coated calcium carbonate; talc; glass ($SiO_2$) fibers; and the like. Preferred CTE reducing agents are calcium carbonate particles treated or coated with an agent, such as stearic acid, to improve the association of calcium carbonate with the polymer. Preferred particle sizes range from 1 to 10 microns, and more preferably 3–5 microns.

As will be appreciated by the skilled artisan, conventional epoxy resin laminates have a CTE of about 65 to 100 ppm. Polyethylene laminates of the invention, without a filler described above, typically have a CTE of about 250 up to 600 ppm and higher. The inventors have found that adding very small amounts of CTE reducing filler, relative to the amount of polymer present, can provide olefin films having a CTE of 100 ppm or less. Conventionally, fillers are added to polymer resins in large weight percentages (i.e., 50–70% filler) for economic reasons, i.e., to decrease resin costs. In contrast, in the present invention, the CTE fillers are used in an amount of about 25 phr or less, and preferably about 5 phr or less. This aspect of the invention is particularly advantageous for printed circuit board applications.

The resultant substantially rigid crosslinked composite laminate structures of the invention can exhibit a variety of desirable properties. For example, as compared to conventional composite reinforcing structures used in the production of circuit boards, the laminates of the invention can exhibit good, and often improved, dielectric properties and electrical charge dissipation factors and excellent drilling properties. In one embodiment of the invention, the laminates exhibit an electrical charge dissipation factor at condition D 48/50 from about 0.0009 to about 0.006 at 1 MHz, and a dielectric constant at condition A from about 2.4 to about 3.0 at 1.0 MHz. In addition, the composite structures can have good copper peel strength, of at least about 5 to 15, preferably 8 to 12, psi. This can be particularly useful in some printed circuit board applications.

The crosslinked composite laminate structures of the invention exhibit excellent drilling properties, as compared to conventional epoxy-based laminates. This is particularly advantageous for printed circuit board applications. The crosslinked composite laminate structures of the invention can be drilled using faster drill speeds, yet the resultant drill temperatures are lower. Other advantages include less drill wear, the ability to drill increased numbers of laminate layers at one time, i.e., to drill higher stacks of laminate sheets, the ability to drill more holes before having to change drills, cleaner holes, less polymer smear, and minimum burrs. These factors all result in improved economies and efficiencies in manufacture, particularly circuit board manufacture.

The sheets of the invention are also useful as components in reinforcing or structural composites for various moldable structures, including sheet molding compositions and the like, as are used to fabricate automotive body parts, aerospace products, ballistic products, sports equipment, furniture, medical products, agricultural products, industrial products, toys, containers, wall panels, appliances and the like. The sheets of the invention are also useful components in products formed by "pultrusion", such as low dielectric ladder rails. Pultrusion is similar to extrusion except in the processing of continuous fibers or rolls of fibrous goods, materials have to be pulled through a die rather than the conventional extrusion operation in which metals or plastic pellets are melted and pushed through a die.

The present invention will be further illustrated by the following non-limiting examples.

EXAMPLE 1

Preparation of Crosslinkable Polyethylene Films

A normally solid, high molecular weight polyethylene having a density greater than 0.941 g/cc and a melt index of 18 g/10 minutes was blended with 0.75 weight percent of 2,5-dimethyl-2,5-di(t-butyl peroxy)-hexyne-3 (Lupersol 130). The composition was heated to about 295°–299° F. and extruded as a thin continuous 38–40" wide film. The composition was extruded using a 4 foot wide slit film die available from Black Clawson. Extrusion rate was about 35–45 feet per minute (fpm).

Films having the following average thickness were extruded: 0.5, 1.0, 3.0, 4.0, and 6.0 mils. The average film thickness and uniformity of the film thickness was determined using a continuously transversing Beta gauge, which measures the mass density of polymer as it is produced. Fifty density measurements were taken for each sample across the width several times per minute. The average thickness of each of the extruded films did not vary by more than about plus or minus 25%. For example, when extruding a 1 mil thick film, the average thickness of the film varied from about 0.9 to about 1.1 mils.

The die gap of the extruder was adjusted so that the gap could be varied in accordance with the desired width of film to be extruded. Each film was cast onto a metal casting roll located about 6 inches below the die. The metal casting roll was rotating at a speed sufficient to draw down the films in a ratio of about 3:1 and higher.

EXAMPLE 2

Preparation of Extrusion Cast Coated Substrates With Crosslinkable Polyethylene

The composition described above was melt extruded as in Example 1, except this time the extrudate was directed between the nip formed by a metal casting roll and a pressure roll having an elastomeric surface, located about 6 inches below the die. Each of the metal casting roll and the elastomeric pressure roll were heated to a temperature of about 200° F. The elastomeric roll had a Shore A hardness of about 75.

Various woven glass substrates, the specific styles of which are set forth below in Table 1, were also directed into the nip so that the glass substrate was adjacent the metal casting roll and the polymer film adjacent the elastomeric roll as shown in FIG. 1. The substrates were heated to a temperature of about 250° F. Both sides of the substrates were coated. The styles selected include those conventionally used in printed circuit board applications.

TABLE 1

| STYLE | YARN SIZES (w × f) | CONSTRUCTION | WEIGHT (OZ/YD.$^2$) | THICKNESS (MILS) |
|---|---|---|---|---|
| 101 | 1800 1/0 × 1800 1/0 | 75 × 75 | 0.5 | 0.8 |
| 106 | 900 1/0 × 900 1/0 | 56 × 56 | 0.73 | 1.5 |
| 108 | 900 1/2 × 900 1/2 | 60 × 47 | 1.43 | 2.5 |

TABLE 1-continued

| STYLE | YARN SIZES (w × f) | CONSTRU-CTION | WEIGHT (OZ/YD.$^2$) | THICKNESS (MILS) |
|---|---|---|---|---|
| 1080 | 450 1/0 × 450 1/0 | | 60 × 47 | 1.45 | 2.5 |
| 2113 | 225 1/0 × 450 1/0 | | 60 × 56 | 2.31 | 2.9 |
| 2116 | 225 1/0 × 225 1/0 | | 60 × 58 | 3.22 | 3.8 |
| 7628 | 75 1/0 × 75 1/0 | | 44 × 32 | 6.00 | 6.8 |
| 7642 | 75 1/0 × 37 1/0 | Text | 44 × 20 | 6.85 | 10.0 |
| 7781 | 75 1/0 × 75 1/0 | | 57 × 54 | 8.95 | 9.0 |

As will be appreciated by the skilled artisan, the style designations of Table 1 indicate different fabric weights and porosities, based upon the weave, fiber size, etc. used in making the glass fabrics.

Films having the following average thicknesses were coated onto the glass substrates: 0.5, 1.0, 3.0, 4.0, and 6.0 mils. The average film thickness and uniformity of the film thickness was determined as described above in Example 1, and the distribution of polymer did not vary more than about plus or minus 25%.

EXAMPLE 3

Preparation of Prepreg From Crosslinkable Polyethylene Film Coated On Continuous Glass Fiber Mat Crosslinkable polyethylene films were also cast extruded onto various other types of substrates in accordance with the present invention. In this example, crosslinkable polyethylene films having an average thickness as set-forth in Example 1 were cast coated onto nonwoven continuous filament glass fiber mats using the same process conditions described in Examples 1 and 2.

EXAMPLE 4

Preparation of Prepreg From Crosslinkable Polyethylene Film Coated On Glass Felt In this example, crosslinkable polyethylene films having an average polymer thickness as set forth in Example 1 were cast extruded onto nonwoven glass felt substrates formed from glass long staple (1.5–2.5 inches) length, again using the same process conditions described in Examples 1 and 2.

EXAMPLE 5

Preparation of Prepreg From Crosslinkable Polyethylene Film Coated On Glass Papr In this example, crosslinkable polyethylene films having an average polymer thickness as set forth in Example 1 were cast extruded onto glass paper, formed of highly compressed, short staple length (0.5–1.5 inches) glass fibers using the same process conditions described in Examples 1 and 2.

EXAMPLE 6

Preparation of Prepreg From Crosslinkable Polyethylene Film Coated On Kraft Paper In this example, crosslinkable polyethylene films having an average polymer thickness as set forth in Example 1 were cast extruded onto Kraft (i.e, wood pulp) paper using the same process conditions described in Examples 1 and 2. Surprisingly, the crosslinkable polyethylene film/Kraft paper structure exhibited excellent inter-ply adhesion without the need for any type of paper surface pretreatment. As the skilled artisan will appreciate, typically, paper surfaces must be pretreated, for example using Corona discharge treatments, to achieve sufficient inter-ply adhesion between a plastics layer and the paper layer.

EXAMPLE 7

Preparation of Prepreg From Crosslinkable Polyethylene Film Coated On Woven Aramid Fabric In this example, crosslinkable polyethylene films having an average polymer thickness as set forth in Example 1 were cast extruded onto two styles of woven aramid fabrics: Style 353, a 5.0 oz/yd$^2$ (osy) weight fabric; and Style 735, a 13.8 osy weight fabric, using the same process conditions described in Examples 1 and 2.

EXAMPLE 8

Preparation of Prepreg From Crosslinkable Polyethylene Film Coated On Woven Nylon Fabric In this example, crosslinkable polyethylene films of about 0.5 mil in thickness were cast extruded onto two styles of woven nylon fabrics: Style 14381, a 7.2 osy weight fabric; and Style 66301, a 6.0 osy weight fabric. The nylon fabric thickness was about 20 mil. The resultant film/fabric structure exhibited good flexibility, despite the presence of a crosslinked polyethylene film coated surface.

EXAMPLE 9

Preparation of Prepreg From Crosslinkable Polyethylene Film Coated On Woven Spectra Fabric In this example, crosslinkable polyethylene films of about 0.5 mil in thickness were cast extruded onto woven Spectra, Style 903, 7.0 osy, a fabric formed of high performance high density polyethylene available from Allied Signal.

EXAMPLE 10

Preparation of Composite Multilayered Structure

Eight plies (individual sheets cut from the continuous prepreg of Example 2 comprising 3.0 mil film on style 7628 woven glass fabric to give a resin/glass ratio of about 55/45) were superimposed and treated to form a substantially rigid composite structure. To form the rigid composite structure, the prepregs were placed in a preheated press at a temperature of 300° F. A contact pressure of about 20 psi for each 12"×12" surface area of the laminate was applied and held for 15 minutes. The pressure was raised to 50 psi for 5 minutes, then increased to 100 psi. After 5 minutes the temperature was increased to 450° F. and maintained under these conditions for 30 minutes to crosslink the polyethylene and to combine the polyethylene sheets with the glass substrate. The laminate was then cooled to ambient temperature and removed from the press.

The electrical properties of the rigid composite structure were evaluated for 20 samples, and the results are set forth in Table 2 below.

TABLE 2

Dielectric Constant and Dissipation Factor
(All samples from same laminate)

| Sample | Dielectric Constant | | Dissipation Factor | |
|---|---|---|---|---|
| No. | Dry | Wet | Dry | Wet |
| 1 | 3.13 | 3.17 | 0.0011 | 0.0054 |
| 2 | 3.19 | 3.18 | 0.0015 | 0.0047 |
| 3 | 3.16 | 3.17 | 0.0013 | 0.0053 |
| 4 | 3.18 | 3.22 | 0.0013 | 0.0053 |
| 5 | 3.11 | 3.14 | 0.0012 | 0.0059 |
| 6 | 3.18 | 3.23 | 0.0015 | 0.0053 |
| 7 | 3.08 | 3.14 | 0.0024 | 0.0059 |
| 8 | 3.12 | 3.16 | 0.0019 | 0.0062 |
| 9 | 3.13 | 3.17 | 0.0030 | 0.0060 |
| 10 | 3.11 | 3.13 | 0.0028 | 0.0058 |
| 11 | 3.06 | 3.08 | 0.0012 | 0.0066 |
| 12 | 3.10 | 3.16 | 0.0017 | 0.0054 |
| 13 | 3.07 | 3.06 | 0.0012 | 0.0053 |
| 14 | 3.09 | 3.15 | 0.0030 | 0.0056 |
| 15 | 3.16 | 3.12 | 0.0028 | 0.0051 |
| 16 | 3.14 | 3.14 | 0.0019 | 0.0061 |
| 17 | 3.41 | 3.18 | 0.0043 | 0.0052 |
| 18 | 3.06 | 3.16 | 0.0010 | 0.0046 |
| 19 | 3.09 | 3.11 | 0.0027 | 0.0057 |
| 20 | 2.76 | 3.08 | 0.0012 | 0.0066 |
| 21 | 3.15 | 3.16 | 0.0020 | 0.0090 |
| 22 | 3.06 | 3.07 | 0.0024 | 0.0067 |
| 23 | 3.13 | 3.16 | 0.0022 | 0.0060 |
| 24 | 3.13 | 3.15 | 0.0021 | 0.0078 |
| Average | 3.12 | 3.15 | 0.0020 | 0.0059 |
| Std. Dev. | 0.102 | 0.042 | 0.0008 | 0.0009 |

In addition, the samples exhibited a dielectric breakdown in excess of 100 kilovolts, low water absorption of 0.001 to 0.01% and excellent thermal shock (i.e., molten solder exposure) resistance at temperatures of 500° F. and 550° F.

EXAMPLE 11

Evaluation of Electrical Properties of Laminate

A 2 mil thick laminate was prepared using techniques described in Example 10 above from prepreg prepared using the techniques described in Examples 1 and 2 above. A 0.5 mil polyethylene film was coated on opposing surfaces of a Style 101 woven glass fabric (1 mil fabric). A half ounce copper foil was then applied on the outer surfaces of the film coating to form a copper layer/film layer/glass fabric/film layer/copper layer multi-laminate structure. The electrical properties of the laminate were tested, and the results are set forth below in Table 3.

TABLE 3

| Dielectric Constant @ 1 MHz | |
|---|---|
| Condition A: | 2.40 |
| Condition D: | 2.40 |
| Dissipation Factor @ 1 MHz | |
| Condition A: | 0.0007 |
| Condition D: | 0.0007 |
| Water Absorption, % | |
| D24/25: | 0 |

In addition, an unsupported 2 mil thick film (no glass fabric) with 0.5 oz./sq.ft. copper on each face was also made. The electrical properties of the unsupported laminate are set forth below in Table 4. The properties of the unsupported film show very low dielectric loss properties. Further, the material is very flexible and chemically resistant with no apparent moisture absorption.

TABLE 4

| Dielectric Constant @ 1 MHz | |
|---|---|
| Condition A: | 1.82 |
| Condition D: | 1.83 |
| Dissipation Factor @ 1 MHz | |
| Condition A: | 0.0006 |
| Condition D: | 0.0007 |
| Water Absorption, % | |
| D24/25: | 0 |

EXAMPLE 12

Evaluation of Drilling Properties of Laminate

Laminates formed from crosslinkable polyethylene/woven glass prepregs prepared as in Example 2 were also evaluated with regard to drilling characteristics. For purposes of comparison, a multilayered rigid composite structure was prepared as described in Example 10 above, using 4 plies of a laminate comprising an inner woven glass fabric (Style 7628) coated with a crosslinkable polyethylene film of 6 mils. The drilling properties of the composite structures of the invention were compared with a conventional epoxy based composite structure including 7 plies of a glass substrate (Style 7628) prepregged with conventional epoxy resin.

Generally, the composite structures of the invention exhibited excellent drilling characteristics. Specifically, the composite structures of the invention were drilled using faster drill speeds, yet with less drill wear. Further, higher stacks (i.e., a greater number of plies of laminates) could be effectively drilled as compared to the epoxy composite structures. Other advantages included: cooler drill temperatures for the composites of the invention as compared to the standard epoxy composites; the ability to drill more holes in the composites of the invention before having to change drill bits; and cleaner holes, with very little polymer smear and minimal number of burrs. For example, using a 35 mil #60 drill as known in the art (0.035 drill), the drill temperature of the drill used with the polyethylene structures ranged from 149°–165° F., well below the glass transition temperature ($T_g$, 266° F.) of the crosslinked polyethylene; in contrast, the drill temperature of about 400° F. for the epoxy composite was well above the $T_g$ of epoxy (275° F.). Using a 13.5 mil #80 drill as known in the art (0.135 drill), the drill temperature of the drill used with the polyethylene structures ranged from 175°–190° F.; in contrast, the drill temperature for the epoxy composite was about 350°–370° F. Accordingly, the holes drilled in the polyethylene composites of the invention were cleaner, with less polymer smear and fewer burrs. This can be advantageous in subsequent circuit board fabrication steps, wherein copper is plated in the holes of the composite. Because the holes are cleaner, the use of polyethylene composite could reduce or eliminate additional processing steps previously required for cleaning the drilled holes.

EXAMPLE 13

Comparison of Physical Properties of the Laminates of the Invention with Conventional Thermoset and Thermoplastic Laminates Physical properties of composite structures prepared in accordance with Example 2 were compared with physical properties of composites prepared using both conventional thermoset resins and conventional thermoplastic polymers. Each composite was prepared using the polymer/resin systems set forth below applied to woven glass fabric, Style 7781. The average thickness of the polymer coatings was 4 mils and comparable prepregs were prepared using resinous substances. The results are set forth below in Table 5:

The laminates of the invention can behave as a thermoplastic laminate, i.e., is thermoformable and flexible, yet also behaves as a thermoset resin, i.e., can withstand high temperatures. The laminates can thus be useful for a variety of structural composite applications, such as the manufacture of automotive, aerospace or consumer products.

EXAMPLE 14

Evaluation of CTE in Z-axis of Laminates

Composite laminate structures were produced in accordance with the procedures set forth in Example 10 above except that a filler was included in some of the polyethylene compositions. The composite laminate structures (5 plies film, 4 plies of Style 7628 woven glass fabric) were evaluated with regard to the thermal expansion exhibited by the structures in the z-axis direction. The results are set forth below in Table 6.

TABLE 6

| Sample | Film Notes | CTE, ppm[1] | Dielectric Constant |
|---|---|---|---|
| Inclusion of Fillers | | | |
| 1 | No Filler | 638.0 | 2.8 |
| 2 | 100 phr[3] Atomite[4] | 359.2 | 3.7 |
| 3 | 100 phr Kotamite[5] | 32.3 | 3.7 |
| 4 | 10 phr Milled FG[6] 100 phr Kotamite | 102.5 | 3.2 |

TABLE 5

STRUCTURAL LAMINATES STYLE 7781 0.125" THICK

| RESIN SYSTEM PROPERTIES | EPOXY | PHENOLIC | POLYESTER | POLYPROPYLENE | NYLON 6,6 | POLYETHYLENE | INVENTION |
|---|---|---|---|---|---|---|---|
| Tensile Strength at Break, psi | 73,000 | 44,000 | 59,000 | 27,000 | 29,000 | 30,000 | 36,000 |
| Compressive Strength, psi | 54,000 | 50,000 | 46,500 | 10,000 | 11,000 | 3,600 | 13,000 |
| Flexural Strength, psi | 92,000 | 75,500 | 84,500 | 21,000 | 24,000 | 13,000 | 27,000 |
| Flexural Modulus, psi | 2.7 | 2.4 | 3.0 | 1.40 | 1.8 | 1.3 | 1.7 |
| Izod Impact, ft-lb/in of notch | 10 | 18 | 14 | 8 | 17 | 7 | 23 |
| Water Absorption, % | 0.20 | 0.18 | 0.10 | 0.24 | 0.22 | 0.03 | 0.012 |

The data demonstrates that the crosslinked polyethylene based composite laminates of the invention can exhibit desirable properties of both thermoset resin systems and thermoplastic polymer systems. For example, the crosslinkable polyethylene laminates of the invention can exhibit improved flexibility as compared to the thermoset resin systems and can be thermoformable. Yet the composite structures of the invention also exhibit improved tensile strength and compressive strength as compared to the conventional thermoplastic polymer systems. In addition, the laminates of the invention exhibit improved impact resistance as compared to both the thermoset and thermoplastic polymer systems.

TABLE 6-continued

| Sample | Film Notes | CTE, ppm[1] | Dielectric Constant |
|---|---|---|---|
| 5 | 10 phr Milled FG 100 phr Atomite | 235.4 | 3.6 |
| 6 | 25 phr Talc[7] | 82.6 | 3.2 |
| 7 | 25 phr Talc 5 phr Milled FG | 77.6 | 3.2 |
| 8 | 25 phr Talc 10 phr Milled | 148.8 | 3.3 |

TABLE 6-continued

| Sample | Film Notes | CTE, ppm[1] | Dielectric Constant |
|---|---|---|---|
| 9 | FG 50 phr Talc | 429.7 | 3.3 |
| Comparative[2] | — | 125.0 | 4.5 |

[1]Below $T_g$
[2]Comparative epoxy resin composite laminate
[3]phr = parts per hundred rating
[4]Atomite - Calcium carbonate (nominal 7 microns, ECC Corp.)
[5]Kotamite - Stearic acid coated calcium carbonate (nominal 7 microns, ECC Corp.)
[6]FG - 1/32 inch milled fiberglass, Owens-Corning, 731-ED
[7]Talc having 3–5 micron particle size available from Luzenze Co. under Mispron. Z5C designation.

EXAMPLE 15

Comparison of Physical and Electrical Properties of Composite Laminates of Invention with Epoxy Laminates Composite laminates in accordance with the invention were prepared as set forth in Example 10 above and the physical and electrical properties thereof were compared with composite laminate structures from glass/epoxy resin prepregs. Sample 1 comprises 8 plies of Style 7628 fabric having crosslinkable polyethylene film coated thereon to provide resin/glass ratio of 52/48 and 0.062" thick composite. Sample 2 is a comparable laminate which comprises 2 outer plies of Style 7628 fabric coated with crosslinkable polyethylene film sandwiching 6 core plies of epoxy prepregged (FR-4) style 7628 fabric. Sample 3 (comparative) is a standard 0.062" FR-4 epoxy laminate. The results are set forth below in Tables 7 and 8.

TABLE 7

| Description | Sample 1 | Sample 2 | Sample 3 |
|---|---|---|---|
| Water Absorption (%)[1] D24/25 | 0.014 | 0.023 | 0.014 |
| Dielectric Constant (@ 1 MHz)[1] | | | |
| A | 3.045 | 3.080 | 3.875 |
| D48/50 | 3.093 | 3.210 | 3.913 |
| Dissipation Factor (@ 1 MHz)[1] | | | |
| A | 0.00315 | 0.00248 | 0.01371 |
| D 48/50 | 0.00992 | 0.00827 | 0.01406 |
| Solder Dip (20 second exposure)[2] | | | |
| 500° F. | 5ND | 5ND | 2B |
| 510° F. | 5ND | 5ND | 2B |
| 550° F. | 5ND | 5ND | 2B |

[1]All testing carried out in accordance with ASTM Methods. "A" denotes condition as received, "D 24/25" denotes 24 hour conditioning in water at 25° C.
[2]IPC 2.6.16 Evaluation Rating (1 = poor to 5 = good) after 45 minutes at 15 psi. "ND" denotes no delamination; "B" denotes blisters.

TABLE 8

| | | Sample 1 | Sample 2 | Sample 3 (Comparative) |
|---|---|---|---|---|
| Dimensional Instability, % | | | | |
| After Etch | LW | 0 | −0.02 | 0.007 |
| | CW | 0 | 0.007 | 0.01 |
| After Bake | LW | −0.03 | 0.007 | 0.007 |
| | CW | 0.07 | 0.05 | 0 |
| Dielectric Constant (@ 1 MHz)[1] | | 2.88 | 3.60 | 4.28 |
| Dissipation Factor (@ 1 MHz)[2] | | 0.0011 | 0.0054 | 0.0110 |
| CTE, ppm | | | | |
| 20° C. to 260° C., ppm | | 677.7 | 325.7 | 128.7 |
| 20° C. 105° C., ppm | | 357.2 | 115.9 | 51.0 |
| 135° C. to 260° C., ppm | | 518.8 | 361.7 | 255.0 |
| Volume Resistivity, megohm-cm. | | $1.2 \times 10^7$ | $3.3 \times 10^7$ | $1.0 \times 10^7$ |
| Surface Resistivity, megohm | | $0.6 \times 10^5$ | $48.0 \times 10^5$ | $6.9 \times 10^5$ |

[1]Dielectric constant and surface and volume resistivity data are the average of three reported sample results. All testing carried out in accordance with ASTM Methods.
[2]Dielectric constant and surface and volume resistivity data are the average of three reported sample results. All testing carried out in accordance with ASTM Methods.

EXAMPLE 16

Evaluation of Water Absorption and Laminate Thickness Consistency

Sample 1 described in Example 15 above was also evaluated with regard to water absorption and consistency of laminate thickness. The results are set forth below in Tables 9 and 10, respectively, below.

TABLE 9

| | Water Absorption (%) | |
|---|---|---|
| | D24/25 | D24/100 |
| Average | 0.031% | 0.021% |
| Standard Deviation | .023 | 0.015 |
| High | 0.085 | 0.079 |
| Low | 0.002 | 0.002 |

TABLE 10

| | Laminate Thickness, inches | | | |
|---|---|---|---|---|
| | Sample 1 | Sample 2 | Sample 3 | Sample 4 |
| Average | 0.073 | 0.073 | 0.073 | 0.073 |
| High | 0.078 | 0.077 | 0.077 | 0.077 |
| Low | 0.070 | 0.072 | 0.070 | 0.069 |

The foregoing examples are illustrative of the present invention, and are not to be construed as limiting thereof. The invention is defined by the following claims, with equivalents of the claims to be included therein.

That which is claimed is:

1. A multilayered composite structure comprising a plurality of adjacent layers, wherein at least one of said adjacent layers comprises a sheet comprising a substrate and a cast film coated onto a surface of said substrate, said cast film having a width of at least about one foot as defined by the cross machine direction of said cast film, said cast film comprising a crosslinkable thermoplastic olefin polymer and a crosslinking agent capable of reacting with and effecting crosslinking of said olefin polymer, said cast film having a substantially uniform average thickness of less than about 10 mils across a substantial portion of the width thereof.

2. The multilayered composite laminate structure according to claim 1, wherein said laminate further comprises a flame retardant agent.

3. The multilayered composite laminate structure according to claim 1 wherein said composite structure has been treated under conditions sufficient to effect crosslinking of said polymer to form a substantially rigid unitary multilayered composite structure.

4. A printed circuit board comprising a laminate according to claim 1.

5. A multilayered composite structure comprising a plurality of adjacent layers, wherein at least one of said adjacent layers comprises a sheet comprising a substrate and a film coated onto a surface of said substrate, said film having a width of at least about one foot as defined by the cross machine direction of said film, said film comprising a crosslinkable thermoplastic olefin polymer and a crosslinking agent capable of reacting with and effecting crosslinking of said olefin polymer, said film having a substantially uniform average thickness of less than about 10 mils across a substantial portion of the width thereof, wherein said film is a cast film produced by extruding a molten composition comprising a crosslinkable thermoplastic olefin polymer and a crosslinking agent capable of reacting with and effecting crosslinking of said olefin polymer, to produce a substantially molten polymer extrudate having a width of at least about one foot as defined by the cross machine direction of said extrudate; and drawing said molten extrudate at a draw down ratio of at least about 3:1 to form a film having a substantially uniform average thickness of less than about 10 mils; and wherein said film is directed into a face-to-face opposing relationship with said substrate; and a substantially uniform pressure is applied across the width of said film and said substrate by directing said film and substrate through the nip formed by cooperating metal casting roll and pressure roll having an elastomeric surface, wherein said pressure roll is in direct contact with said molten film to provide a substantially uniform film thickness of less than about 10 mils across a substantial portion of the width thereof.

6. A multilayered composite structure comprising a plurality of adjacent layers, wherein at least one of said adjacent layers comprises a sheet comprising a substrate and a cast film coated onto a surface of said substrate, said film having a width of at least about one foot as defined by the cross machine direction of said film, said film comprising a crosslinkable thermoplastic olefin polymer and a crosslinking agent capable of reacting with and effecting crosslinking of said olefin polymer, said film having a substantially uniform average thickness of less than about 5 mils across a substantial portion of the width thereof.

* * * * *